United States Patent [19]

Redwood et al.

[11]  4,254,387
[45]  Mar. 3, 1981

[54] ACOUSTIC WAVE DEVICES

[75] Inventors: Martin Redwood, Sevenoaks; Richard Stevens, Copthorne; Philip D. White, Chessington; Richard F. Mitchell, Merstham, all of England

[73] Assignee: U.S. Philips Corporation, New York, N.Y.

[21] Appl. No.: 947,141

[22] Filed: Sep. 29, 1978

[30] Foreign Application Priority Data

Oct. 6, 1977 [GB] United Kingdom ............... 41654/77

[51] Int. Cl.$^3$ ........................ H03H 9/25; H03H 9/64; H03H 9/145
[52] U.S. Cl. .............................. 333/194; 310/313 B; 333/195; 333/196
[58] Field of Search ............................... 333/150–155, 333/193–196; 310/313; 331/107 A

[56] References Cited

U.S. PATENT DOCUMENTS 3,961,293  6/1976  Hartmann et al. ............. 310/313 X
4,072,915  2/1978  Mitchell ........................ 310/313 X

OTHER PUBLICATIONS

Lakin et al., "Surface Wave Resonators", 1975 Ultrasonics Symposium Proceedings, IEEE Cat. #75, CHO 994-4SU; pp. 269-278.

Primary Examiner—Marvin L. Nussbaum
Attorney, Agent, or Firm—Thomas A. Briody; William J. Streeter; Bernard Franzblau

[57] ABSTRACT

An acoustic wave resonator device comprises a substrate carrying a pair of spaced apart reflectors forming a resonant cavity that supports only three adjacent distinct resonant mode frequencies. An interdigital transducer is disposed on the substrate between the reflectors and includes an array of electrodes symmetrically arranged relative to a central point of the cavity to form a plurality of electrode pairs with the electrodes of each pair equally spaced on opposite sides of the central point. The central point of the cavity coincides with a node or an anti-node of the standing wave. If the two electrodes of each electrode pair are connected to the same terminal then the transducer has zero net coupling with one set of alternate modes of the cavity, whereas if said two electrodes are connected to opposite terminals then the transducer has zero net coupling with the other set of alternate modes.

13 Claims, 7 Drawing Figures

ACOUSTIC WAVE DEVICES

This invention relates to acoustic wave resonator devices including a substrate able to propagate acoustic waves, a pair of spaced apart reflectors forming a resonant cavity capable of supporting an acoustic standing wave in the substrate at a plurality of distinct resonant mode frequencies, a pair of terminals, and a transducer including an array of electrodes interdigitally connected to said terminals and disposed on a surface of the substrate between the pair of reflectors for coupling with acoustic standing wave energy in the cavity.

Devices of the above type may be used singly or in combination as frequency filters particularly at VHF frequencies.

U.S. Pat. No. 3,961,293 describes a surface acoustic wave device of the above type. FIG. 1 of this patent illustrates a resonant cavity formed by two opposing reflective grating structures and a single interdigital transducer located in the cavity. FIG. 2 of this patent shows the location, relative to the effective centres of the reflective grating structures, of nodes for standing wave resonance patterns for three adjacent mode frequencies, and the location of the interdigital transducer of FIG. 1 in the cavity is discussed with reference to FIG. 2. At column 6 lines 23 to 32 the excitation of these three modes is discussed in the case where the interdigital transducer is placed at a point approximately midway between the two reflective grating structures and properly positioned so as to efficiently excite one of those modes, i.e. with the points midway between adjacent fingers of the transducer coinciding with nodes in the resonance pattern of that mode. At column 6 lines 32 to 36 it is then stated that "From the preceding discussion it will be seen heuristically that input interdigital transducers located approximately midway between the reflective grating structures are able to efficiently excite only every other mode of the cavity. If the input interdigital transducer, however, is located near one of the reflective grating structures it is possible to efficiently excite all the modes of the cavity."

This invention is concerned with the suppression of alternate modes supported by an acoustic standing wave resonant cavity. One reason for wanting to suppress alternate modes is that in cases where the cavity is required to have a very high Q value this may necessitate a large cavity which results in adjacent modes having a smaller spacing than required for a particular application. Suppression of alternate modes then doubles that spacing.

Two disadvantageous restrictions in the above-mentioned teaching of U.S. Pat. No. 3,961,293 that an interdigital transducer can be made to couple to only alternate modes of the cavity by location of the transducer at the middle of the cavity rather than near the reflectors are firstly that for a given space between the reflectors this teaching can only be adhered to by a small size transducer which may be smaller than is necessary for a required strength of coupling to the cavity, and secondly that for resonator devices which require two interdigital transducers to be located in the cavity this teaching can only be adhered to for one of the transducers.

An object of the invention is to provide an acoustic wave resonator device in which an interdigital transducer has a net zero coupling with alternate modes of the cavity without the above-mentioned disadvantageous restrictions.

The basic idea of the invention is that an array of electrodes which is interdigitally connected in the transducer is symmetrically arranged with respect to a central point of the cavity so as to form a plurality of pairs of electrodes with the electrodes of each pair being equally spaced in opposite directions from that central point. If the two electrodes of each pair are connected to the same terminal then the transducer has zero net coupling with one set of alternate modes whereas if the two electrodes of each pair are connected to opposite terminals then the transducer has zero net coupling with the other set of alternate modes. Thus the transducer can be considered as made up of two equal halves, one in each half of the cavity. In the case of a single transducer being present in the cavity, each half of the transducer can occupy anything from a small portion of its half of the cavity which may be near the centre or near the reflectors up to the whole of its half of the cavity. If two transducers are required to be in the cavity both transducers can have equally efficient suppression of the required set of alternate modes with the two halves of one transducer being adjacent in a region between the two halves of the other transducer.

According to a first aspect of the invention there is provided an acoustic wave resonator device including a substrate able to propagate acoustic waves, a pair of spaced apart reflectors forming a resonant cavity capable of supporting an acoustic standing wave in the substrate at a plurality of distinct resonant mode frequencies, a pair of terminals, and a transducer including an array of electrodes interdigitally connected to said terminals and disposed on a surface of the substrate between the pair of reflectors for coupling with acoustic standing wave energy in the cavity, characterized in that the array of electrodes is symmetrically arranged with respect to a central point of the cavity which coincides with an anti-node and a node respectively of the standing wave at an odd mode frequency and an even mode frequency which constitute each adjacent pair of said plurality of distinct mode frequencies, the array of electrodes forms a plurality of pairs of electrodes with the effective centres of the two electrodes of each pair being equally spaced in opposite directions parallel to the length of the cavity from said central point of the cavity, the two electrodes of each pair are electrically connected in common to the same one or other of said pair of terminals whereby the transducer has a zero net coupling with standing wave energy at each said even mode frequency, and the spacing of the electrodes from said central point of the cavity is furthermore arranged to ensure that the transducer has a non-zero net coupling with standing wave energy at at least one said odd mode frequency.

In FIG. 3 of U.S. Pat. No. 4,072,915 a surface acoustic wave resonant cavity is shown having therein an interdigital transducer including two similar arrays of electrodes, the electrodes of each array having a centre-to-centre spacing of half a wavelength at a predetermined frequency, the spacing between the two arrays being three quarters of a wavelength at that frequency, and the point mid-way between the two arrays being at the centre of the cavity. The two arrays form pairs of electrodes with the two electrodes of each pair being equally spaced in opposite directions from the centre of the cavity and connected to opposite bus bars of the transducer. The predetermined frequency is one at which the resonant cavity is capable of supporting a standing wave and the description envisages that the cavity may support a standing wave at other frequencies near that frequency. The transducer shown in FIG. 3 is only one example of coupling means for coupling with acoustic surface wave energy in the cavity comprising two arrays of conductive strips (another example is a multistrip coupler where the strips are electrically insulated from each other) arranged according to a teaching which ensures suppression of the response to internal reflections of acoustic surface waves within the coupling means. The symmetrical disposition of the two arrays with respect to the centre of the cavity shown in FIG. 3 is not essential according to this teaching which permits the point mid-way between the two arrays to be displaced by half a wavelength or an integral multiple of half a wavelength from the centre of the cavity.

A resonator device according to the basic idea of the invention which is described in the same terms as the above statement of the first aspect of the invention with the modification that the two electrodes of each pair are electrically connected to different ones of said pair of terminals whereby the transducer has a zero net coupling with standing wave energy at each said odd mode frequency would include within its scope the above-mentioned arrangement of FIG. 3 of Offenlegungsschrift U.S. Pat. No. 4,072,915. Therefore, devices according to three distinct aspects of the invention will hereinafter be stated and discussed each of which provide odd mode suppression according to the basic idea of the invention but which have a detailed form which is not known from the arrangement of FIG. 3 of the aforesaid U.S. patent.

According to a second aspect of the invention there is provided an acoustic wave resonator device including a substrate able to propagate acoustic waves, a pair of spaced apart reflectors forming a resonant cavity capable of supporting an acoustic standing wave in the substrate at a plurality of distinct resonant mode frequencies, a pair of terminals, and a transducer including an array of electrodes interdigitally connected to said terminals and disposed on a surface of the substrate between the pair of reflectors for coupling with acoustic standing wave energy in the cavity, characterized in that the array of electrodes is symmetrically arranged with respect to a central point of the cavity which coincides with an antinode and a node respectively of the standing wave at an odd mode frequency and an even mode frequency which constitute each adjacent pair of said plurality of distinct mode frequencies, the array of electrodes forms a plurality of pairs of electrodes with the effective centres of the two electrodes of each pair being equally spaced in opposite directions parallel to the length of the cavity from said central point of the cavity, the two electrodes of each pair are electrically connected to different ones of said pair of terminals whereby the transducer has a zero net coupling with standing wave energy at each said odd mode frequency, the spacing of the electrodes from said central point of the cavity is furthermore arranged to ensure that the transducer has a non-zero net coupling with standing wave energy at at least one said even mode frequency, and each said electrode is split into two electrode parts displaced from the effective centre of that electrode by equal distances in opposite directions parallel to the length of the cavity.

The arrangement of FIG. 3 of U.S. Pat. No. 4,072,915 is according to a teaching providing an arrangement for internal reflection suppression in interdigital transducers which is an alternative to the known split electrode arrangement. The above-stated second aspect of the invention, by virtue of including the feature of split electrodes, thus not only excludes the arrangement of FIG. 3 of U.S. Pat. No. 4,072,915 but is contrary to its teaching.

According to a third aspect of the invention there is provided an acoustic wave resonator device including a substrate able to propagate acoustic waves, a pair of spaced apart reflectors forming a resonant cavity capable of supporting an acoustic standing wave in the substrate at a plurality of distinct resonant mode frequencies, a pair of terminals, and a transducer including an array of electrodes interdigitally connected to said terminals and disposed on a surface of the substrate between the pair of reflectors for coupling with acoustic standing wave energy in the cavity, characterized in that each said reflector is a periodic grating structure having a reflective frequency passband and comprising a plurality of discrete discontinuities at said substrate surface, each discontinuity being provided for reflecting a portion of acoustic wave energy incident thereon, the configuration of the reflectors relative to the distance by which they are spaced apart is arranged so that the combined reflective frequency passband of the pair of reflectors includes only three adjacent distinct resonant mode frequencies, a central point of the cavity coinciding with a node and an anti-mode respectively of the standing wave at an even mode frequency which is the middle one of said three frequencies and at odd mode frequencies which are the other two of said three frequencies, the array of electrodes is symmetrically arranged with respect to said central point of the cavity and forms a plurality of pairs of electrodes with the effective centres of the two electrodes of each pair being equally spaced in opposite directions parallel to the length of the cavity from said central point of the cavity, the two electrodes of each pair are electrically connected to different ones of said pair of terminals whereby the transducer has a zero net coupling with standing wave energy at both odd mode frequencies, and the spacing of the electrodes from the central point of the cavity is furthermore arranged to ensure that the transducer has a non-zero net coupling with standing wave energy at said even mode frequency.

The feature included in the above-stated third aspect of the invention of a cavity in which the combined reflective frequency passband of the reflectors includes only three adjacent modes is not known from and does not follow any teaching of the above-mentioned U.S. Pat. No. 4,072,915.

The Q value of the cavity is approximately inversely proportional to $1-|R|$ where R is the reflectivity of the reflectors for values of $|R|$ close to unity and is proportional to the effective length L of the cavity. Thus where a high Q value of the cavity is required this is achieved in the first instance by making R as close to unity as possible. Where the reflectors are grating structures, a high value of R is associated with a large number of discontinuities, i.e. reflecting elements, in each grating. However, as the number of elements is increased eventually the size of the gratings becomes inconveniently large. Thus for a further improvement in the Q value the effective length L of the cavity, which is dependent on the distance by which the reflectors are spaced apart, must be large. The resonant modes which the cavity is capable of strongly supporting are those modes which occur at frequencies within the combined reflective frequency passband of the reflectors. A large number of reflecting elements in each grating reflector results in a narrow reflective frequency passband, and a large distance between the two grating reflectors results in a small frequency separation between adjacent mode frequencies. Where the distance between the reflectors is large the reflective frequency passband of the reflectors can be made small to counteract the correspondingly small frequency separation between adjacent mode frequencies and thereby include only a small number of mode frequencies. We have found however that when the reflective frequency passband is reduced so as to include only three resonant modes further reduction of the reflective frequency passband or reduction in the effective length L does not result in exclusion of the two outer modes, that is to say that those two outer modes become closer to the central mode and remain at the edges of the reflective frequency passband. Thus if a device is required having single mode operation the configuration of the grating reflectors relative to the distance by which they are spaced apart can be arranged so that the combined reflective frequency passband of the pair of reflectors includes only three adjacent distinct resonant mode frequencies and a transducer can be provided in the cavity according to the basic idea of the invention so as to have a zero net coupling with standing wave energy in the cavity at the two outer mode frequencies and a non-zero net coupling with standing wave energy at the middle mode frequency.

According to a fourth aspect of the invention there is provided an acoustic wave resonator device including a substrate also to propagate acoustic waves, a pair of spaced apart reflectors forming a resonant cavity capable of supporting an acoustic standing wave in the substrate at a plurality of distinct resonant mode frequencies, a pair of terminals, and a transducer including an array of electrodes interdigitally connected to said terminals and disposed on a surface of the substrate between the pair of reflectors for coupling with acoustic standing wave energy in the cavity, characterized in that said transducer is an input transducer for converting input electrical energy applied to said pair of terminals into acoustic wave energy propagating in the substrate, in that there is provided a pair of output terminals, in that there is provided an output transducer including an array of electrodes interdigitally connected to said output terminals and disposed on said surface between the pair of reflectors for coupling with acoustic standing wave energy in the cavity, and in that for both the input transducer and the output transducer the respective said array of electrodes is symmetrically arranged with respect to a central point of the cavity which coincides with an antinode and a node respectively of the standing wave at an odd mode frequency and an even mode frequency which constitute each adjacent pair of said plurality of distinct mode frequencies, the respective said array of electrodes forms a plurality of pairs of electrodes with the effective centres of the two electrodes of each pair being equally spaced in opposite directions parallel to the length of the cavity from said central point of the cavity, the two electrodes of each pair are electrically connected to different ones of said respective pair of input or output terminals whereby both the input transducer and the output transducer have a zero net coupling with standing wave energy at each said odd mode frequency, and the spacing of the electrodes of each respective array from the central point of the cavity is furthermore arranged to ensure that both the input transducer and the output transducer have a non-zero net coupling with standing wave energy at at least one said even mode frequency.

The feature included in the above-stated fourth aspect of the invention of two transducers in the cavity each of which includes an interdigitally connected array of electrodes which is symmetrically arranged with respect to the central point of the cavity is not known from and does not follow any teaching of the above-mentioned U.S. Pat. No. 4,072,915. On the contrary, the teaching of this patent which permits the point midway between the two arrays of the coupling means specified therein to be displaced by half a wavelength or an integral multiple of half a wavelength from the centre of the cavity tends to indicate that such displacement should be used if two coupling means, each of which may be transducers, are to be accommodated in the same cavity.

The features of split electrodes, a cavity which strongly supports only three resonant modes, and the presence of two transducers in the cavity which respectively distinguish a device having odd mode suppression from U.S. Pat. No. 4,072,915 according to the second, third and fourth aspects of the invention are equally applicable to a device having even mode suppression according to the first aspect of the invention.

An electrical filter may be provided including two acoustic wave resonator devices, both according to the first aspect of the invention, or both according to the second aspect of the invention, or both according to the third aspect of the invention in which said transducer in one of the devices forms input transducing means arranged to launch acoustic wave energy into the cavity of that device which forms acoustic standing wave energy therein, in which means are provided for coupling the cavities of the two devices whereby acoustic standing wave energy is formed in the cavity of the other device, and in which said transducer in the other device forms output transducing means arranged to receive acoustic wave energy from the cavity of the other device.

An electrical filter may be provided including at least a first and a second acoustic wave resonator device, each according to the fourth aspect of the invention, in which the output terminals of the first device are electrically connected to the input terminals of the second device for coupling the two devices.

A known property of coupled resonator electrical filters is that for resonators having a given Q value, strong coupling between the resonators is associated with a low insertion loss of the filter and a large bandwidth passband at the or each coupled mode frequency whereas weak coupling between the resonators is associated with a high insertion loss of the filter and a small bandwidth passband at the or each coupled mode frequency. For a filter having a required small bandwidth associated with the appropriate weak degree of coupling between the resonators, the insertion loss will be lower if the Q value of the resonators is higher. Thus low loss very narrow bandwidth coupled resonator filters require very high Q resonators. In this case, if these very high Q resonators are of the acoustic wave resonant cavity type with periodic grating reflectors and the coupled resonator filter is required to have a very low stopband level outside a low loss single resonant mode narrow passband, then the two adjacent outer modes respectively above and below the frequency of the required single mode which will be strongly supported by the cavities, since they cannot be brought outside the reflective frequency passband of the reflectors as has been discussed above, become a problem. The frequency of the single required mode will be arranged to be at the centre of the reflective frequency passband and thus the amplitude of these two outer modes will be lower than this central mode as a result of the sloping sides of the reflective frequency passband. The general level of the stopband response of the filter outside these three coupled resonant modes of the cavities can be lowered by the cascading of the cavities to a very low level which is below the amplitude of the two outer modes. In this case, the arrangement of the transducers according to the basic idea of the invention so that they do not couple to these two outer modes will enable an unspoilt stopband response of the filter to be achieved at the cascaded very low level outside the required very narrow low loss single mode passband in the frequency ranges where a response due to the two outer modes would otherwise be present above that very low level.

In resonator devices or electrical filers according to the invention the acoustic waves which the substrates are able to propagate may be surface acoustic waves propagating in the surface of the substrates on which the transducers and reflectors are disposed or they may be bulk acoustic waves propagating parallel and close to that surface of the substrate. The possible use of this type of bulk acoustic wave is mentioned in connection with delay line feedback oscillators in U.K. Pat. No. 1,451,326 and a range of rotated Y-cuts of quartz with propagation perpendicular to the X-axis suitable for this purpose is described in Electronics Letters, Mar. 3, 1977, Vol. 13, No. 5 at pages 128 to 130.

The invention will now be described in more detail with reference to the accompanying drawings, in which.

Figure 1:
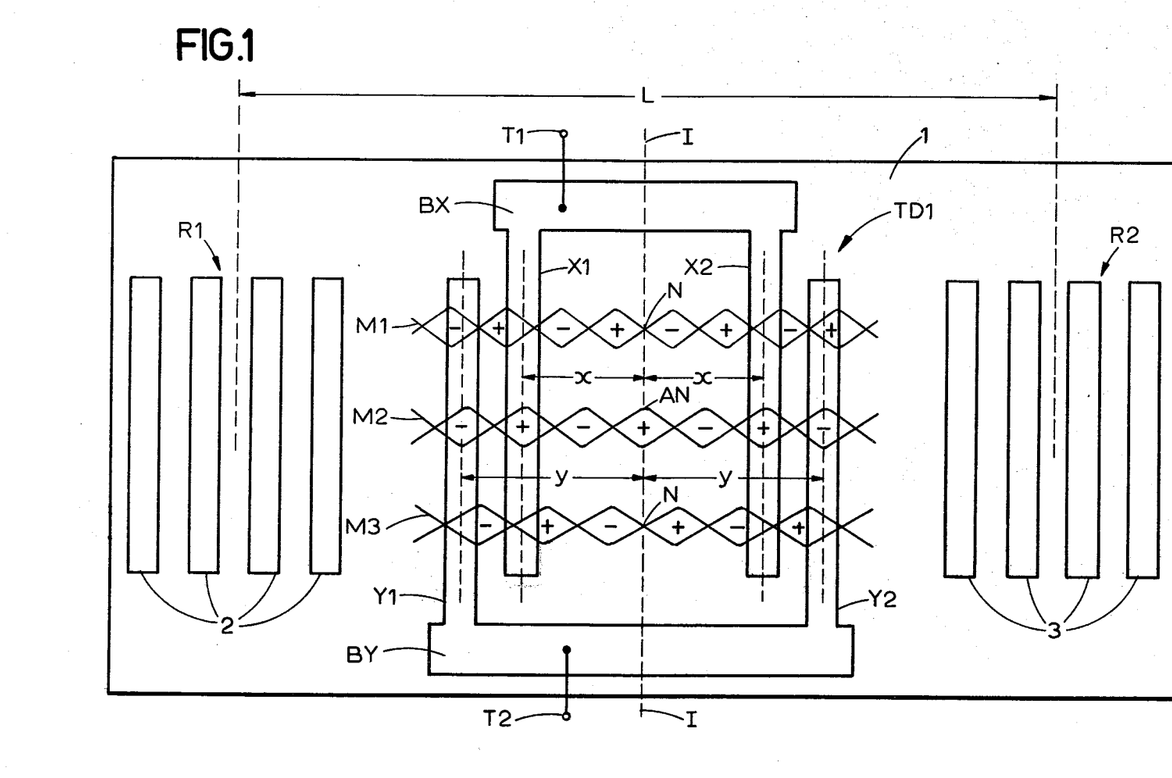
FIG. 1 is a schematic plan view of an acoustic wave resonator device according to the invention having a resonant cavity and an interdigital transducer in the cavity arranged for zero coupling to even modes supported by that cavity.

Referring now to FIG. 1, there is shown in plan view a substrate 1 able to propagate acoustic waves. This substrate may be any well known piezoelectric substrate able to propagate surface acoustic waves in the surface shown, e.g. lithium niobate or quartz; or it may be a piezoelectric substrate able to propagate bulk acoustic waves parallel and close to the surface shown, e.g. a rotated Y-cut of quartz with propagation perpendicular to the X-axis as described in Electronics Letters, Mar. 3, 1977, Vol 13, No. 5 at pages 128 to 130. In the remainder of the description of this invention the substrate 1 will be assumed to be one of these two types and reference to acoustic waves will mean the appropriate surface acoustic waves or particular type of bulk waves just described.

A pair of spaced apart reflectors R1 and R2 form a resonant cavity capable of supporting an acoustic standing wave in the substrate 1 at a plurality of distinct resonant mode frequencies. Each reflector R1 and R2 is a periodic grating structure comprising a plurality of discrete discontinuities, 2 and 3 respectively, at the surface 1. Each discontinuity, which may be for example a conductive strip on the surface or a groove in the surface, is provided for reflecting a portion of acoustic wave energy incident thereon. The reflectors R1 and R2 each have a reflective frequency passband, and in a typical example each of the reflectors R1 and R2 consists of 200 discontinuites 2 and 3 having an effective spacing of half a wavelength $\lambda/2$ of the acoustic waves at a frequency of 100 Mhz providing a reflective passband of 2 MHz centred on said frequency of 100 MHz. The effective length L of the resonant cavity is substantially an integral number of half wavelengths at each of the resonant mode frequencies. In the typical example just mentioned the length L is 500$\lambda$ at 100 MHz including a spacing of 400$\lambda$ between the nearest elements 2 and 3 of the reflectors R1 and R2. This length L determines a spacing of 100 KHz between adjacent resonant mode frequencies and thus the cavity is capable of supporting 20 resonant modes within the reflective passband of 2 MHz.

The standing wave resonance pattern for each mode will exhibit nodes and antinodes in acoustic stress and strain and also nodes and antinodes in electrical potential measured at the surface. In this specification, reference to nodes and antinodes is intended to refer to minima and maxima respectively of electrical potential measured at the surface. A central point of the cavity, which is on the line I—I shown in FIG. 1, coincides with a node and an antinode respectively of the standing wave at an even mode frequency and an odd mode frequency which constitute each adjacent pair of the mode frequencies supported by the cavity. The resonance patterns for three adjacent modes M1, M2 and M3 at successively decreasing frequency, i.e. increasing wavelength, are shown in FIG. 1. The modes M1 and M3 are at even mode frequencies with a node N at the centre line I—I and the mode M2 is at an odd mode frequency with an anti-node AN at the centre line I—I. The positive and negative signs in FIG. 1 show the relative phase of the resonant patterns of the three modes relative to the centre line I—I at a given instant.

A transducer TD1 includes an array of electrodes Y1, X1, X2, and Y2 disposed on the surface 1 between the pair of reflectors R1 and R2 for coupling with acoustic standing wave energy in the cavity and interdigitally connected via bus bars BX and BY to a pair of terminals T1 and T2. The array of electrodes is symmetrically arranged with respect to the centre line I—I and forms two pairs of electrodes with the effective centres (shown by the dotted lines) of the two electrodes of each pair being equally spaced in opposite directions parallel to the length of the cavity from the centre line I—I. The pair X1 and X2 are spaced by a distance x from the line I—I and the pair Y1 and Y2 are spaced by a distance y from the line I—I. The pair X1 and X2 are electrically connected in common via the bus bar BX to the terminal T1, and the pair Y1 and Y2 are electrically connected in common via the bus bar BY to the terminal T2. For both the even modes M1 and M3, the electrodes X1 and X2 are located at opposite phases of equal magnitude of the standing wave pattern and the electrodes Y1 and Y2 are also located at opposite phases of equal magnitude of the standing wave pattern. A transducer TD1 consisting of pairs of electrodes with each pair arranged in the same manner as the pairs X1, X2 and Y1, Y2 thus has zero net coupling with standing wave energy at every even mode frequency of standing waves which the cavity is capable of supporting, irrespective of the actual values of the distances x and y. Thus if the transducer is an input transducer and an alternating potential difference is applied to the terminals T1 and T2 at the frequencies of these even modes then these even mode standing waves will not be excited, and if the even mode standing waves exist in the cavity and the transducer is an output transducer zero output electrical signal will appear at the terminals T1 and T2 at the frequencies of these even modes. For the odd mode M2, the electrodes X1 and X2 are located at the same phase of equal magnitude of the standing wave pattern and the electrodes Y1 and Y2 are also located at the same phase of equal magnitude of the standing wave pattern. As shown in FIG. 1 x is an integral number of half wavelengths at the frequency of the mode M2 and y is one half wavelength greater than x at that frequency, and so the transducer has a maximum coupling with standing wave energy at the frequency of the mode M2. Thus if the transducer is an input transducer and an alternating potential difference is applied to the terminals T1 and T2 at the frequency of the mode M2 that odd mode standing wave will be exited with the maximum efficiency, and if the odd mode M2 standing wave exists in the cavity and the transducer is an output transducer electrical signal will appear at the terminals T1 and T2 at the frequency of that mode M2 with the maximum amplitude. For the transducer TD1 to be useful the actual values of the distances x and y must be arranged to ensure that the transducer has a non-zero net coupling with standing wave energy at at least one odd mode frequency which the cavity is capable of supporting. For example, if the distances x and y were such that all the electrodes were located on nodes of a particular odd mode or were such that all the electrodes were located on antinodes of the same phase of a particular odd mode, and in either such case if that odd mode were the only one which the cavity was capable of supporting then the transducer would not be useful.

Figure 2:
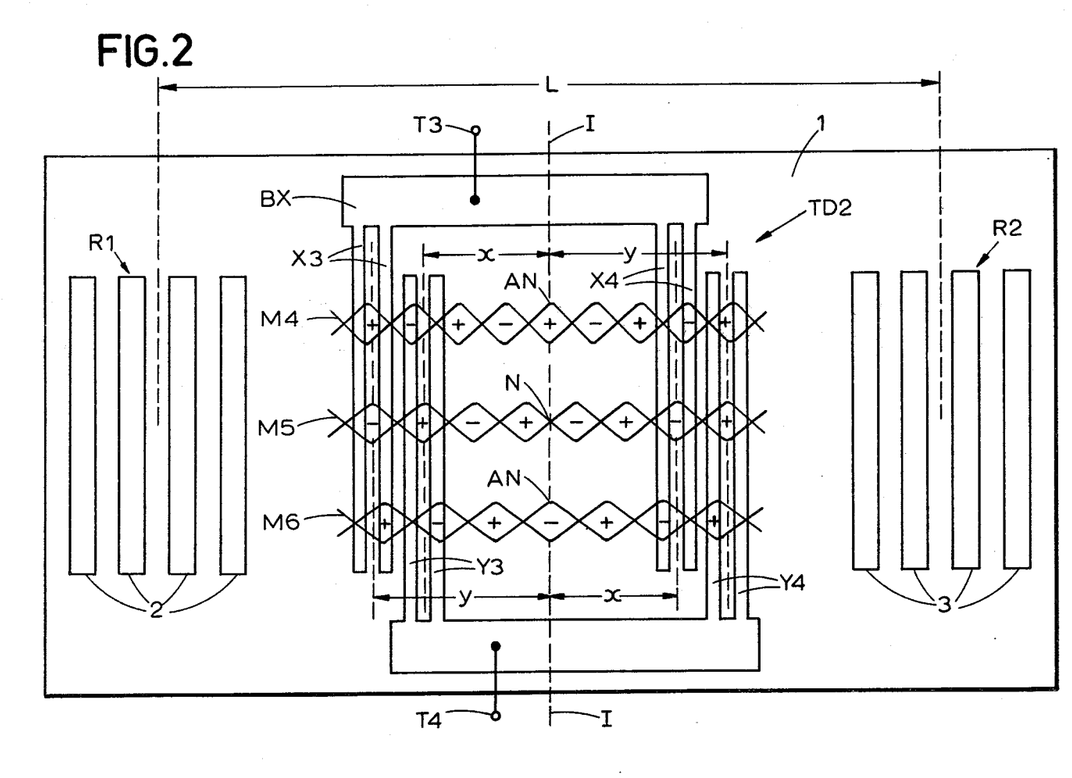
FIG. 2 is a schematic plan view of a device similar to that shown in FIG. 1 but in which the interdigital transducer is arranged for zero coupling to odd modes supported by the cavity.

Referring now to FIG. 2, the substrate 1 is the same as that shown in FIG. 1 and the reflectors R1 and R2 comprising discontinuities 2 and 3 are the same as those shown in FIG. 1. The resonance patterns for three adjacent modes M4, M5, and M6 are shown, the modes M4 and M6 being at odd mode frequencies with an antinode AN at the centre line I—I and the mode M5 being at an even mode frequency with a node N at the centre line I—I.

A transducer TD2 includes an array of electrodes X3, Y3, X4 and Y4 disposed on the surface 1 between the pair of reflectors R1 and R2 for coupling to acoustic standing wave energy in the cavity and interdigitally connected via the bus bars BX and BY to a pair of terminals T3 and T4. Each of the electrodes is split into two electrode parts displaced from the effective centre of that electrode (shown by the dotted lines) by equal distances in opposite directions parallel to the length of the cavity. The array of electrodes is symmetrically arranged with respect to the centre line I—I and forms two pairs of electrodes with the effective centres of the two electrodes of each pair being equally spaced in opposite directions parallel to the length of the cavity from the centre line I—I. The pair Y3 and X4 are spaced by a distance x from the line I—I and the pair X3 and Y4 are spaced by a distance y from the line I—I. The pair Y3 and X4 are electrically connected to different ones of the terminals T4 and T3 respectively by the bus bars BY and BX, and the pair X3 and Y4 are electrically connected to different ones of the terminals T3 and T4 respectively by the bus bars BX and BY. For both the odd modes M4 and M6, the electrodes Y3 and X4 are located at the same phases of equal magnitude of the standing wave pattern and the electrodes X3 and Y4 are also located at the same phases of equal magnitude of the standing wave pattern. A transducer TD2 consisting of pairs of electrodes with each pair arranged in the same manner as the pairs Y3, X4 and X3, Y4 thus has zero net coupling with standing wave energy at every odd mode frequency of standing waves which the cavity is capable of supporting, irrespective of the actual values of the distances x and y. For the even mode M5, the electrodes Y3 and X4 are located at opposite phases of equal magnitude of the standing wave pattern and the electrodes X3 and Y4 are also located at opposite phases of equal magnitude of the standing wave pattern. As shown in FIG. 2 x is an integral number of half wavelengths at the frequency of the mode M5 and y is one half wavelength greater than x at that frequency, and so the transducer has a maximum coupling with standing wave energy at the frequency of the mode M5. For the transducer TD2 to be useful the actual values of the distances x and y must be arranged to ensure that the transducer has a non-zero net coupling with standing wave energy at at least one even mode frequency which the cavity is capable of supporting.

Figure 3:
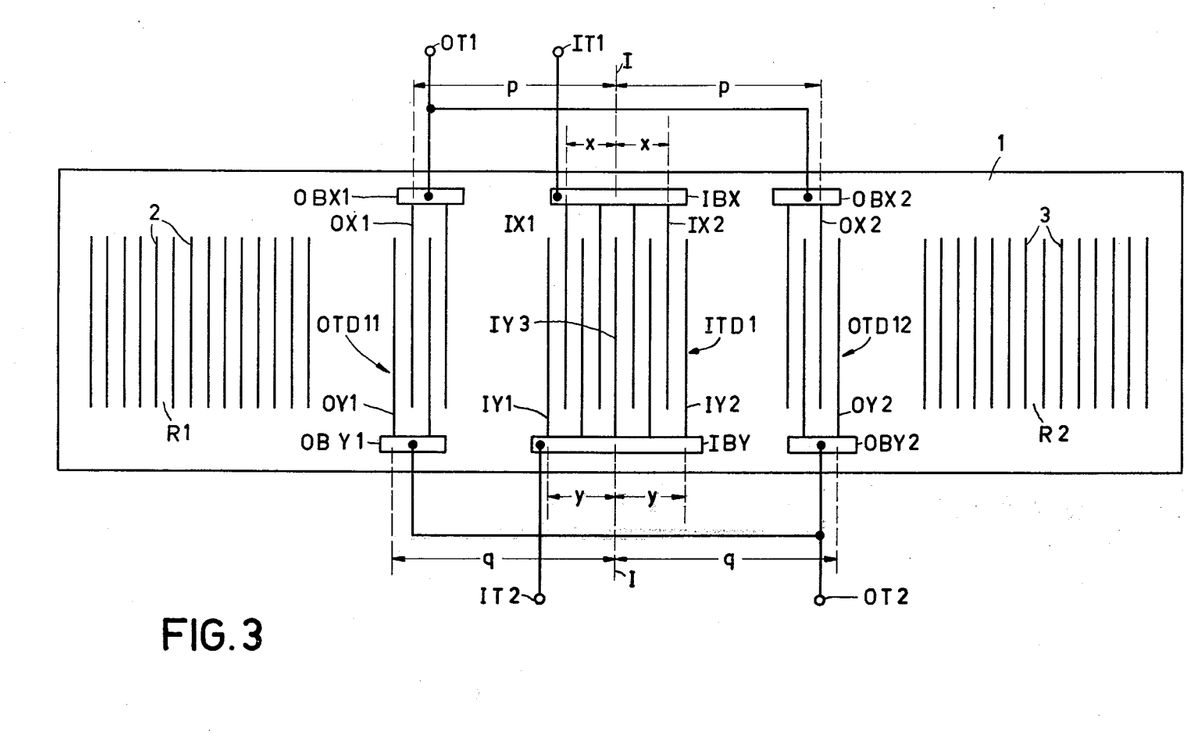
FIG. 3 is schematic plan view of an acoustic wave resonator device according to the invention having a resonant cavity and two interdigital transducers in the cavity each arranged for zero coupling to even modes supported by the cavity, this being on a reduced scale compared with FIGS. 1 and 2.

Referring now to FIG. 3, the substrate 1 is the same as that shown in FIGS. 1 and 2 and the reflectors R1 and R2 comprising discontinuities 2 and 3 are the same as those shown in FIGS. 1 and 2. Two transducers ITD1 and OTD11, OTD12 are provided, each arranged for even mode suppression in the same manner as the transducer TD1 of FIG. 1. An input transducer ITD1 has two adjacent halves, each half comprising four electrodes, on either side of an electrode at the centre I—I of the cavity formed by the reflectors R1 and R2. The array of electrodes of transducer ITD1 is interdigitally connected via bus bars IBX and IBY to a pair of input terminals IT1 and IT2. The array of electrodes of transducer ITD1 is symmetrically arranged with respect to the centre line I—I and, in addition to an electrode IY3 which is on the centre line I—I, forms four pairs of electrodes with the effective centres of the two electrodes of each pair being equally spaced in opposite directions parallel to the length of the cavity from the centre line I—I. For example, the outer pair of electrodes are referenced IY1 and IY2 and are shown spaced by a distance y from the line I—I and the adjacent pair of electrodes are referenced IX1 and IX2 and are shown spaced by a distance x from the line I—I. An output transducer has two halves OTD11 and OTD12, each half comprising four electrodes, on either side of the centre line I—I and separated by the input transducer ITD1. The array of electrodes of the transducer OTD11, OTD12 is interdigitally connected via bus bars OBX1, OBX2, OBY1 and OBY2 to a pair of output terminals OT1 and OT2. The array of electrodes of transducer OTD11, OTD12 is symmetrically arranged with respect to the centre line I—I and forms four pairs of electrodes with the effective centres of the two electrodes of each pair being equally spaced in opposite directions parallel to the length of the cavity from the centre line I—I. For example, the outer pair of electrodes are referenced OY1 and OY2 and are shown spaced by a distance q from the line I—I and the adjacent pair of electrodes are referenced OX1 and OX2 and are shown spaced by a distance p from the line I—I. For both the input transducer ITD1 and the output transducer OTD11, OTD12 the two electrodes of each pair, as described above, are electrically connected in common to the same one or other of the respective pair of input or output terminals whereby both the input transducer and the output transducer have a zero net coupling with standing wave energy at each even mode frequency at which the cavity is capable of supporting an acoustic standing wave, and the spacing of the electrodes of each respective array from the central line I—I of the cavity, i.e. the actual values of the distances x, y, p and q, is furthermore arranged to ensure that both the input transducer ITD1 and the output tranducer OTD11, OTD12 have a non-zero net coupling with standing wave energy at at least one odd mode frequency at which the cavity is capable of supporting an acoustic standing wave. The electrode IY3 of the input transducer ITD1 which completes a regularly spaced array of interdigital electrodes for that transducer and is additional to the pairs of electrodes described, by virtue of being on the centre line I—I is on a node for all the even modes. It is consistent with the zero coupling to those even modes and contributes to the coupling to the odd modes.

Figure 4:
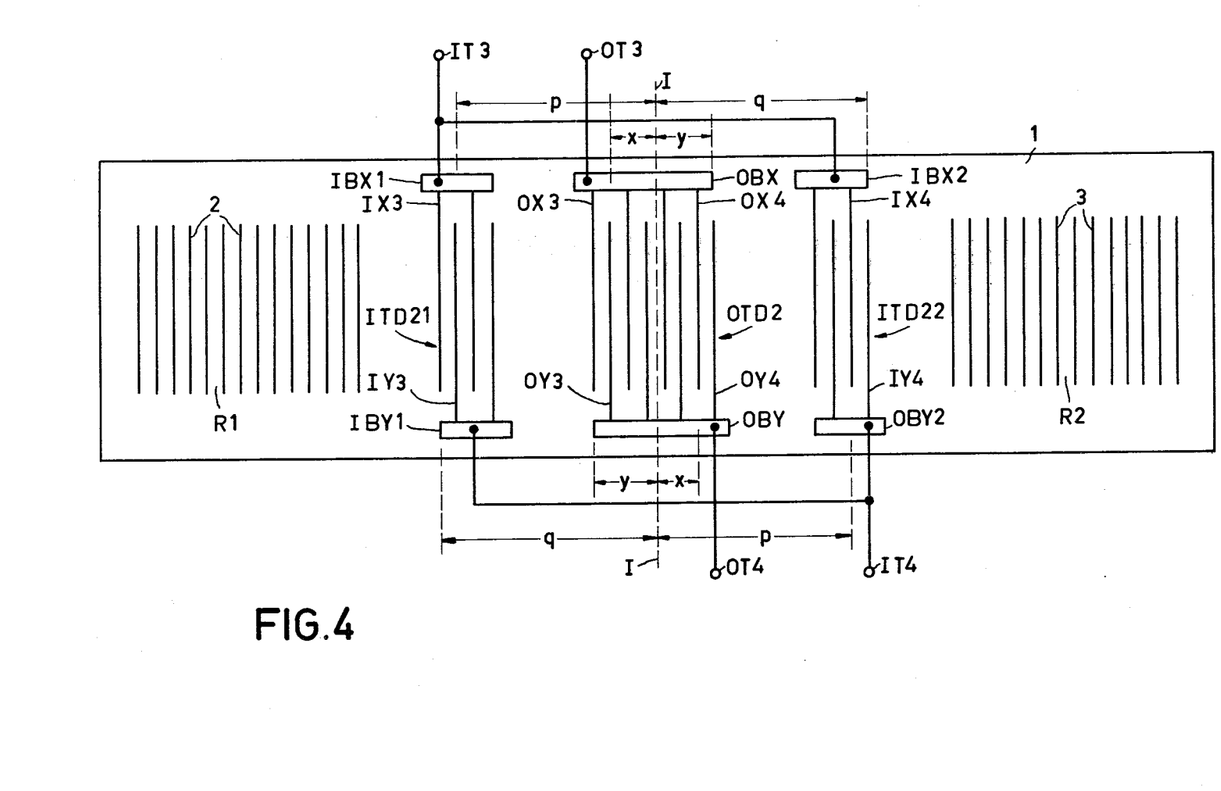
FIG. 4 is a schematic plan view of a device similar to that shown in FIG. 3 but in which the two transducers are each arranged for zero coupling to odd modes supported by the cavity.

Referring now to FIG. 4, the substrate 1 is the same as that shown in FIGS. 1 and 2 and the reflectors R1 and R2 comprising discontinuities 2 and 3 are the same as those shown in FIGS. 1 and 2. Two transducers OTD2 and ITD21, ITD22 are provided, each arranged for odd mode suppression in the same manner as the transducer TD2 of FIG. 2. An output transducer OTD2 has two adjacent halves, each half comprising four electrodes, on either side of the centre line I—I of the cavity formed by the reflectors R1 and R2. The array of electrodes of transducer OTD2 is interdigitally connected via bus bars OBX and OBY to a pair of output terminals OT3 and OT4. The array of electrodes of transducer OTD2 is symmetrically arranged with respect to the centre line I—I and forms four pairs of electrodes with the effective centres of the two electrodes of each pair being equally spaced in opposite directions parallel to the length of the cavity from the centre line I—I. For example, the outer pair of electrodes are referenced OX3 and OY4 and are shown spaced by a distance y from the line I—I and the adjacent pair of electrodes are referenced OY3 and OX4 and are shown spaced by a distance x from the line I—I. An input transducer has two halves ITD21 and ITD22, each half comprising four electrodes, on either side of the centre line I—I and separated by the output transducer OTD2. The array of electrodes of the transducer ITD21, ITD22 is interdigitally connected via bus bars IBX1, IBX2, IBY1 and IBY2 to a pair of input terminals IT3 and IT4. The array of electrodes of transducer ITD21, ITD22 is symmetrically arranged with respect to the centre line I—I and forms four pairs of electrodes with the effective centres of the two electrodes of each pair being equally spaced in opposite directions parallel to the length of the cavity from the centre line I—I. For example, the outer pair of electrodes are referenced IX3 and IY4 and are shown spaced by a distance q from the line I—I and the adjacent pair of electrodes are referenced IY3 and IX4 and are shown spaced by a distance p from the line I—I. For both the output transducer OTD2 and the input transducer ITD21, ITD22 the two electrodes of each pair, as described above, are electrically connected to different ones of the respective pair of output or input terminals whereby both the output transducer and the input transducer have a zero net coupling with standing wave energy at each odd mode frequency at which the cavity is capable of supporting an acoustic standing wave. The spacing of the electrodes of each respective array from the central line I—I of the cavity, i.e. the actual values of the distances x, y, p and q, is furthermore arranged to ensure that both the output transducer OTD2 and the input transducer ITD21, ITD22 have a non-zero net coupling with standing wave energy at at least one even mode frequency at which the cavity is capable of supporting an acoustic standing wave.

In FIGS. 3 and 4, the transducer electrodes may be single electrodes as shown for the transducer TD1 in FIG. 1 or split electrodes as shown for the transducer TD2 in FIG. 2.

Figure 5:
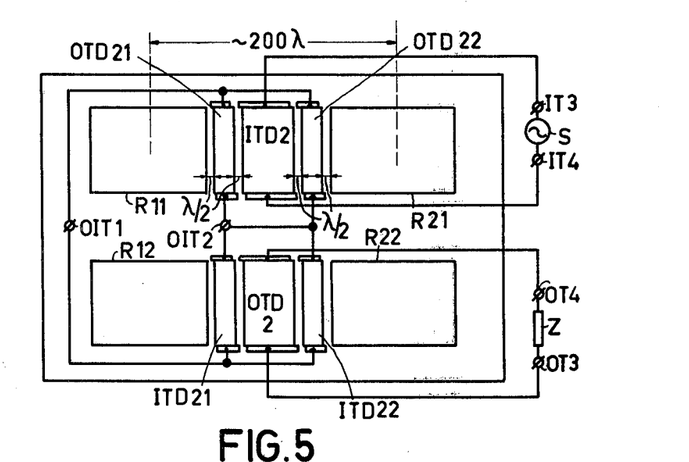
FIG. 5 is a schematic plan view of a coupled acoustic wave resonator electrical filter according to the invention in which two resonant cavities are transducer coupled, this being on a still further reduced scale.

Referring now to FIG. 5, two devices on the same substrate 1, each having two transducers arranged as shown in FIG. 4 to have zero coupling to odd modes, are coupled together. The pair of reflectors R11 and R21, and also the pair of reflectors R12 and R22 are provided and arranged in the same manner as the pair of reflectors R1 and R2 shown in FIGS. 1 and 2. The configuration and arrangement of the transducers ITD1 and OTD21, OTD22, and also the configuration and arrangement of the transducers OTD2 and ITD21, ITD22 are the same in their respective cavities as that of the transducers OTD2 and ITD21, ITD22 in their respective cavity in FIG. 4. The input transducer ITD2 is connected to a source of electrical energy S via terminals IT3 and IT4 and the output transducer OTD21, OTD22 is connected to terminals OIT1 and OIT2. The input transducer ITD21, ITD22 is connected to the terminals OIT1 and OIT2 and the output transducer OTD2 is connected to a load Z via terminal OT3 and OT4. Two acoustic wave resonator devices coupled together as shown in FIG. 5 by electrically connecting the output terminals of the first device to the input terminals of the second device form a coupled resonator electrical filter. More than two such devices may be coupled to form an electrical filter, in which case the first and second devices shown will form part of that filter.

Figure 6:
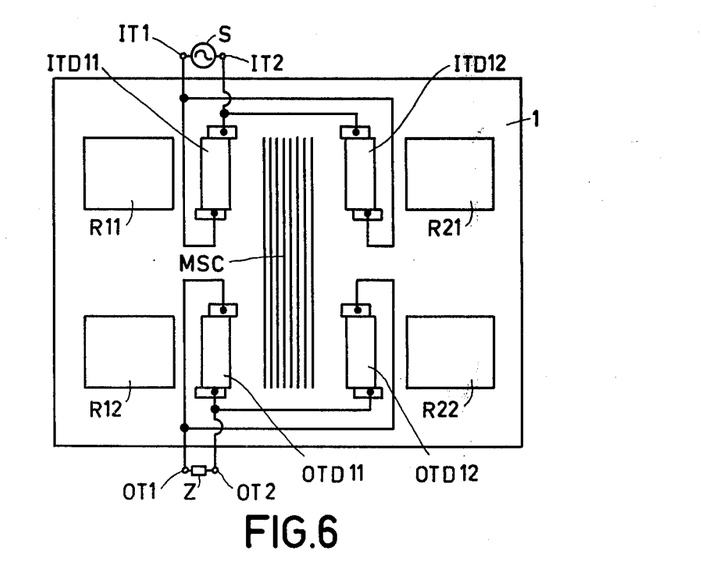
FIG. 6 is a schematic plan view of a coupled acoustic wave resonator electrical filter according to the invention, on the same scale as FIG. 5, in which two resonant cavities are coupled by a multistrip coupler.

Referring now to FIG. 6, two devices on the same substrate 1, each having a two part transducer arranged to have zero coupling to even modes, are coupled together. The pair of reflectors R11 and R21, and also the pair of reflectors R12 and R22 are provided and arranged in the same manner as the pair of reflectors R1 and R2 shown in FIGS. 1 and 2. The configuration and arrangement of the transducers ITD11, ITD12 and OTD11, OTD12 are the same in their respective cavities as that of the transducer OTD11, OTD12 in the respective cavity in FIG. 3. The input transducer ITD11, ITD12 is connected to a source of electrical energy S via terminals IT1 and IT2 and the output transducer OTD11, OTD12 is connected to a load Z via terminals OT1 and OT2. The cavities of the two acoustic wave resonator devices are coupled by a multistrip coupler MSC which consists of an array of discrete parallel conducting strips on the substrate 1 electrically insulated from each other, located in the two cavities and extending between them. Acoustic wave energy launched by the transducer ITD11, ITD12 into the cavity formed by the reflectors R11 and R21 forms acoustic standing wave energy in that cavity and part of that standing wave energy is transferred as electrical energy by the strips of the coupler array MSC to be relaunched as acoustic wave energy in the cavity formed by the reflectors R12 and R22 and so form acoustic standing wave energy in that cavity which is received by the transducer OTD11, OTD12. The two coupled resonator devices form an electrical filter. Alternatively, they may be included in an electrical filter having more than two coupled resonator devices.

Some possible further variations of the specific arrangements of the coupled resonator filters just described with reference to FIGS. 5 and 6 are as follows. The FIG. 5 transducers could be arranged for even mode suppression instead of odd mode suppression. Also the outer transducers could be for connection to the source and load respectively with the cavities being coupled by connection of the inner transducers, or the outer transducer in one cavity and the inner transducer in the other cavity could be for connection to the source and load respectively with the cavities being coupled by connection of the other two transducers. The FIG. 6 transducers could be arranged for odd mode suppression instead of even mode suppression. Also two multistrip couplers could be provided, one on each side of a single transducer in each cavity which has its two halves adjacent at the centre of the cavity instead of the arrangement shown where a single multistrip coupler is provided in the region between the two halves of a single transducer in each cavity.

Figure 7:
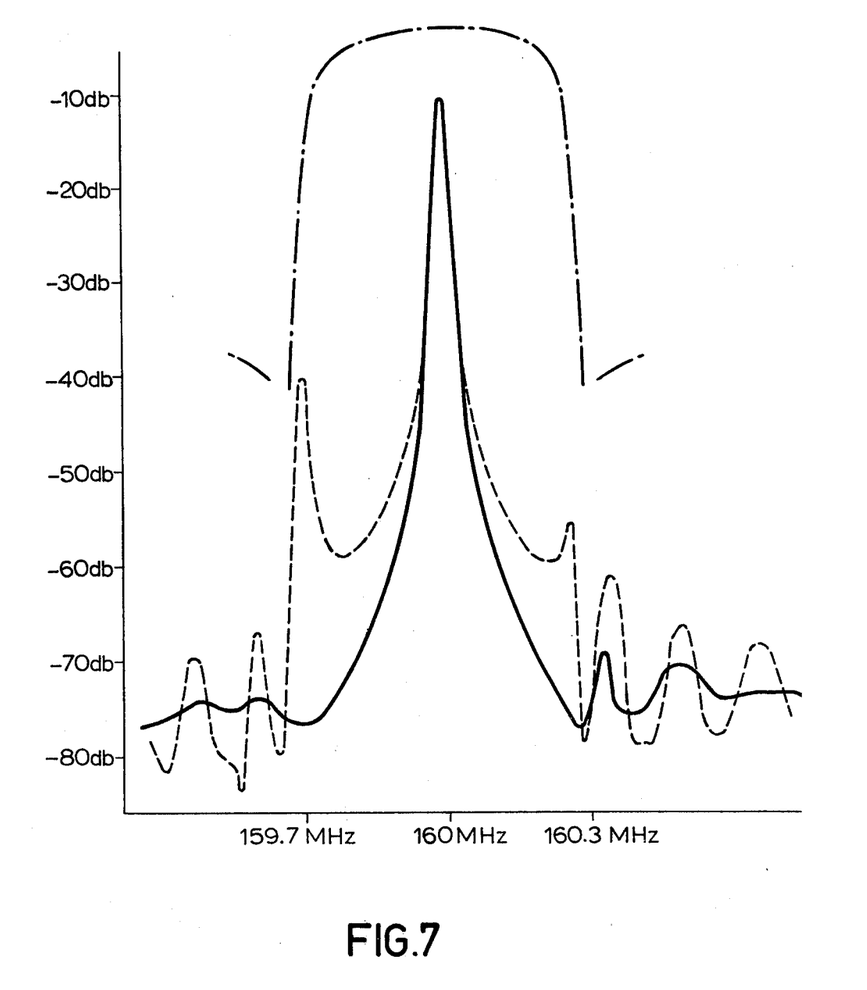
FIG. 7 shows a typical frequency response of a transducer coupled surface acoustic wave coupled resonator electrical filter in which two cavities have a combined reflective frequency passband which includes only three resonant modes and the transducers within the cavities are arranged to have maximum coupling to standing wave energy at the middle mode frequency and zero coupling to standing wave energy at the two outer mode frequencies.

FIG. 7 shows a typical frequency response of a transducer coupled surface acoustic wave coupled resonator electrical filter designed to have a low loss narrow passband and in which a low stopband level is achieved outside that passband by design of the resonators such that the combined reflective frequency passband of the resonator reflectors includes only three resonant modes and by arrangement of the transducers so that they couple to only the middle one of those three modes. The filter whose response is shown in FIG. 7 is generally in accordance with the arrangement shown in FIG. 5, that is to say that there are two resonant cavities, each cavity is formed by two periodic grating reflectors, within each cavity there are two transducers each arranged for alternate mode suppresion, one transducer in one of the cavities is an input transducer, one transducer in the other cavity is an output transducer and the other two transducers are connected to couple the two cavities. The numerical values given in the more detailed description of this filter which now follows are approximate values only for providing a guide to the realization of a filter having the response shown in FIG. 7. The substrate is ST cut quartz capable of supporting surface acoustic waves. The reflectors which form the cavities each consist of 750 metal strips on the surface of the substrate having an effective spacing of half a wavelength of surface acoustic waves at a centre frequency of 160 MHz providing a reflective passband of 600 KHz centred on said centre frequency of 160 MHz. The spacing between the two reflectors of each cavity is 150 wavelengths and the effective length of each cavity is approximately 250 wavelengths at said centre frequency providing a separation between the frequencies of adjacent resonant modes of the cavities of 300 KHz. Thus the configuration of the reflectors relative to the distance by which they are spaced apart is such that the combined reflective frequency passband of the reflectors of the resonators includes only three adjacent distinct resonant mode frequencies of which the centre mode frequency is said centre frequency of 160 MHz. In each cavity the centre transducer occupies a distance of 60 wavelengths and the two halves of the outer transducer each occupy a distance of 30 wavelengths at said centre frequency along the length of the cavity. All the transducers are interdigital transducers having split electrodes whose effective centres are spaced by half a wavelength at said centre frequency of 160 MHz and the transducers are arranged to couple with maximum efficiency to the resonant mode at the centre frequency of 160 MHz and to have zero coupling to the two other resonant modes which the cavities are capable of supporting at 159.7 MHz and 160.3 MHz respectively. The frequency response of this filter as shown in FIG. 7 (the solid line) is a bandpass response having an insertion loss of 10 db in a 50 ohm system at the peak response frequency of 160 MHz. This insertion loss can be reduced to approximately 6 db by appropriate impedance matching of the input and output transducers to the external circuit, and it can be further reduced to approximately 3 db by connecting an inductance across the coupling transducers. The bandwidth of the response at 3 db below the peak response is 20 KHz. The stopband level of the response in the region adjacent the bandpass response is approximately 60 db below the peak response. The dotted outline shows the response to the two modes at 159.7 MHz and 160.3 MHz which would be present at levels of 30 db and 45 db respectively below the peak response if the transducers were not arranged to have zero coupling to those two modes. The dash-dotted outline shows the combined reflective frequency passband of the reflectors of the resonators. The improvement in the stopband level of the filter response achieved by the arrangement of the transducers for alternate mode suppression is thus apparent.

What we claim is:

1. An acoustic wave resonator device comprising, a substrate able to propagate acoustic waves, a pair of spaced apart reflectors on the substrate forming a resonant cavity capable of supporting an acoustic standing wave in the substrate at a plurality of distinct resonant mode frequencies, a pair of terminals, a transducer including an array of electrodes interdigitally connected to said terminals and disposed on a surface of the substrate between the pair of reflectors for coupling with acoustic standing wave energy in the cavity, each said reflector comprising a periodic grating structure having a reflective frequency passband and comprising a plurality of discrete discontinuities at said substrate surface for reflecting a portion of acoustic wave energy incident thereon, the configuration of the reflectors relative to the distance by which they are spaced apart being arranged so that the combined reflective frequency passband of the pair of reflectors includes only three adjacent distinct resonant mode frequencies, the array of electrodes being symmetrically arranged with respect to a central point of the cavity which coincides with an anti-node and a node respectively of the standing wave at an odd mode frequency which comprises the middle one of said three frequencies and at even mode frequencies which comprise the other two of said three mode frequencies, the array of electrodes forming a plurality of pairs of electrodes with the effective centres of the two electrodes of each pair being equally spaced in opposite directions parallel to the length of the cavity from said central point of the cavity, and means electrically connecting the two electrodes of each pair in common to the same one or other of said pair of terminals whereby the transducer has a zero net coupling with standing wave energy at both said even mode frequencies, and the spacing of the electrodes from said central point of the cavity is arranged so that the transducer has a non-zero net coupling with standing wave energy at said odd mode frequency.

2. An acoustic wave resonator device comprising, a substrate able to propagate acoustic waves, a pair of spaced apart reflectors forming a resonant cavity capable of supporting an acoustic standing wave in the substrate at a plurality of distinct resonant mode frequencies, a pair of terminals, a transducer including an array of electrodes interdigitally connected to said terminals and disposed on a surface of the substrate between the pair of reflectors for coupling with acoustic standing wave energy in the cavity, each said reflector comprising a periodic grating structure having a reflective frequency passband and comprising a plurality of discrete discontinuities at said substrate surface for reflecting a portion of acoustic wave energy incident thereon, the configuration of the reflectors relative to the distance by which they are spaced apart being arranged so that the combined reflective frequency passband of the pair of reflectors includes only three adjacent distinct resonant mode frequencies, a central point of the cavity coinciding with a node and an anti-node respectively of the standing wave at an even mode frequency which is the middle one of said three frequencies and at odd mode frequencies which comprise the other two of said three frequencies, the array of electrodes being symmetrically arranged with respect to said central point of the cavity and forming a plurality of pairs of electrodes with the effective centres of the two electrodes of each pair being equally spaced in opposite directions parallel to the length of the cavity from said central point of the cavity, and means electrically connecting the two electrodes of each pair to different ones of said pair of terminals whereby the transducer has a zero net coupling with standing wave energy at both odd mode frequencies, and the spacing of the electrodes from the central point of the cavity is arranged so that the transducer has a non-zero net coupling with standing wave energy at said even mode frequency.

3. A resonator device as claimed in claim 1 or 2, in which each said electrode is split into two electrode parts displaced from the effective centre of that electrode by equal distances in opposite directions parallel to the length of the cavity.

4. An electrical filter comprising two acoustic wave resonator devices as claimed in claims 1 or 2 wherein said transducer in one of the devices forms input transducing means arranged to launch acoustic wave energy into the cavity of that device which forms acoustic standing wave energy therein, and means for coupling the cavities of the two devices whereby acoustic standing wave energy is formed in the cavity of the other device, and wherein said transducer in the other device forms output transducing means arranged to receive acoustic wave energy from the cavity of the other device.

5. An electrical filter comprising two acoustic wave resonator devices as claimed in claims 1, 3 or 2, in which said transducer in one of the devices forms input transducing means arranged to launch acoustic wave energy into the cavity of that device which forms acoustic standing wave energy therein, and means for coupling the cavities of the two devices whereby acoustic standing wave energy is formed in the cavity of the other device, and in which said transducer in the other device forms output transducing means arranged to receive acoustic wave energy from the cavity of the other device.

6. An acoustic wave resonator device comprising a substrate able to propagate acoustic waves, a pair of spaced apart reflectors on the substrate forming a resonant cavity capable of supporting an acoustic standing wave in the substrate at a plurality of distinct resonant mode frequencies, a pair of terminals, a transducer including an array of electrodes interdigitally connected to said terminals and disposed on a surface of the substrate between the pair of reflectors for coupling with acoustic standing wave energy in the cavity, said transducer being an input transducer for converting input electrical energy applied to said pair of terminals into acoustic wave energy propagating in the substrate, a pair of output terminals, an output transducer including an array of electrodes interdigitally connected to said output terminals and disposed on said surface between the pair of reflectors for coupling with acoustic standing wave energy in the cavity, and wherein for both the input transducer and the output transducer the respective said array of electrodes is symmetrically arranged with respect to a central point of the cavity which coincides with an anti-node and a node respectively of the standing wave at an odd mode frequency and an even mode frequency which constitute each adjacent pair of said plurality of distinct mode frequencies, the respective said array of electrodes forming a plurality of pairs of electrodes with the effective centres of the two electrodes of each pair being equally spaced in opposite directions parallel to the length of the cavity from said central point of the cavity, and means electrically conecting the two electrodes of each pair to different ones of said respective pair of input or output terminals whereby both the input transducer and the output transducer have a zero net coupling with standing wave energy at each said odd mode frequency and the spacing of the electrodes of each respective array from the central point of the cavity is arranged so that both the input transducer and the output transducer have a non-zero net coupling with standing wave energy at at least one said even mode frequency.

7. A resonator device as claimed in claim 6, wherein each said reflector comprises a periodic grating structure having a reflective frequency passband and comprising a plurality of discrete discontinuities at said substrate surface for reflecting a portion of acoustic wave energy incident thereon, and in which the configuration of the reflectors relative to the distance by which they are spaced apart is arranged so that the combined reflective frequency passband of the pair of reflectors includes only three adjacent distinct resonant mode frequencies of which the centre frequency is an even mode frequency and is thus the only mode frequency at which the transducers have a non-zero net coupling with standing wave energy.

8. An acoustic wave resonator device comprising a substrate able to propagate acoustic waves, a pair of spaced apart reflectors on the substrate forming a resonant cavity capable of supporting an acoustic standing wave in the substrate at a plurality of distinct resonant mode frequencies, a pair of terminals, a transducer including an array of electrodes interdigitally connected to said terminals and disposed on a surface of the substrate between the pair of reflectors for coupling with acoustic standing wave energy in the cavity, said transducer being an input transducer for converting input electrical energy applied to said pair of terminals into acoustic wave energy propagating in the substrate, a pair of output terminals, an output transducer including an array of electrodes interdigitally connnected to said output terminals and disposed on said surface between the pair of reflectors for coupling with acoustic standing wave energy in the cavity, and wherein for both the input transducer and the output transducer the respective said array of electrodes is symmetrically arranged with respect to a central point of the cavity which coincides with an anti-node and a node respectively of the standing wave at an odd mode frequency and an even mode frequency which constitute each adjacent pair of said plurality of distinct mode frequencies the respective said array of electrodes forming a plurality of pairs of electrodes with the effective centres of the two electrodes of each pair being equally spaced in opposite directions parallel to the length of the cavity from said central point of the cavity, and means electrically connecting the two electrodes of each pair in common to the same one or other of said respective pair of input or output terminals whereby both the input transducer and the output transducer have a zero net coupling with standing wave energy at each said even mode frequency, and the spacing of the electrodes of each respective array from the central point of the cavity is arranged so that both the input transducer and the output transducer have a non-zero net coupling with standing wave energy at at least one said odd mode frequency.

9. A resonator device as claimed in claim 8 wherein each said reflector comprises a periodic grating structure having a reflective frequency passband and comprising a plurality of discrete discontinuities at said substrate surface for reflectin a portion of acoustic wave energy incident thereon, an wherein the configuration of the reflectors relative to the distance by which they are spaced apart is arranged so that the combined reflective frequency passband of the pair of reflectors includes only three adjacent distinct resonant mode frequencies of which the centre frequency is an odd mode frequency and is thus the only mode frequency at which the transducers have a non-zero net coupling with standing wave energy.

10. A resonator device as claimed in claims 6, 7, 8 or 9 wherein each said electrode is split into two electrode parts displaced from the effective centre of that electrode by equal distances in opposite directions parallel to the length of the cavity.

11. An electrical filter comprising at least a first and a second acoustic wave resonator device, each as claimed in any one of claims 6, 7, 8 or 9 wherein the output terminals of the first device are electrically connected to the input terminals of the second device for coupling the two devices.

12. A resonator device as claimed in any one of claims 1, 2, 6, 7, 8 or 9 wherein the acoustic waves which a substrate is able to propagate are surface acoustic waves propagating in said surface of that substrate.

13. A resonator device as claimed in any one of claims 1, 2, 6, 7, 8 or 9 wherein the acoustic waves which a substrate is able to propagate are bulk acoustic waves propagating parallel and close to said surface of that substrate.

* * * * *